(12) United States Patent
Yamamoto et al.

(10) Patent No.: US 6,512,783 B1
(45) Date of Patent: Jan. 28, 2003

(54) SEMICONDUCTOR LASER AND METHOD OF MANUFACTURING THE SAME

(75) Inventors: Tsuyoshi Yamamoto, Kanagawa (JP); Hajime Shoji, Kanagawa (JP); Takayuki Watanabe, Yamanashi (JP); Takuya Fujii, Yamanashi (JP); Hirohiko Kobayashi, Kanagawa (JP)

(73) Assignees: Fujitsu Limited, Kawasaki (JP); Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 09/453,546

(22) Filed: Dec. 3, 1999

(30) Foreign Application Priority Data

Dec. 7, 1998 (JP) .......................... 10-346842

(51) Int. Cl.$^7$ .......................... H01S 5/00; H01L 21/00
(52) U.S. Cl. .......................... 372/45; 372/46; 438/40; 438/41
(58) Field of Search .................. 372/43–46; 438/39–41

(56) References Cited

U.S. PATENT DOCUMENTS

| | | | | |
|---|---|---|---|---|
| 4,841,536 A | * | 6/1989 | Ohishi et al. .................. | 372/46 |
| 5,260,230 A | * | 11/1993 | Kondo .......................... | 438/40 |
| 5,390,205 A | * | 2/1995 | Mori et al. .................... | 372/46 |
| 5,441,912 A | * | 8/1995 | Tsukiji et al. ................. | 438/40 |
| 5,596,592 A | | 1/1997 | Tanigami et al. .............. | 372/46 |
| 5,665,612 A | * | 9/1997 | Lee et al. ....................... | 438/40 |
| 5,764,842 A | * | 6/1998 | Aoki et al. .................. | 385/131 |

FOREIGN PATENT DOCUMENTS

| | | |
|---|---|---|
| DE | 195 31 052 A1 | 2/1996 |
| JP | 6-125131 | 5/1994 |
| JP | 8-97509 | 4/1996 |

OTHER PUBLICATIONS

M. Gotoda et al., Extremely smooth vertical facets of InP formed by reactive ion etching and selective chemical beam epitaxy regrowth, Journal of Crystal Growth 145 (1994) 675–679.

M. Takemi et al., Metalorganic vapor–phase epitaxial regrowth of InP on reactive ion–etched mesa structures for p–substrate buried heterostructure laser appliction, Journal Crystal Growth 180 (1997) 1–8.

Y. Ohkura et al., Low Threshold FS–BH Laser on p–InP Substrate Grown by All–MOCVD, Electronics Letters 1844–1845, Sep. 10, 1992, vol. 28 No. 19.

Hiroshi Sugimoto et al., Suppression of Side–Etching in C2H6/H2/O2 Reactive Ion Etching for the Fabrication of an InGaAsP/InP P–Substrate Buried–Heterostructure Laser Diode, J. Electrochem. Sec., vol. 140, No. 12, Dec. 1993, 3615–3620 (The Electrochemical Society, Inc.).

* cited by examiner

*Primary Examiner*—Paul Ip
*Assistant Examiner*—James Menefee
(74) *Attorney, Agent, or Firm*—Armstrong, Westerman & Hattori, LLP

(57) ABSTRACT

There is provided a semiconductor laser which comprises a first cladding layer formed of compound semiconductor having first conductivity type impurity and having a mesa-shaped projection, an active layer formed on the projection like a stripe and having side surfaces which are inclined at an angle of more than 70 degrees but less than 90 degrees relative to an upper surface of the first cladding layer, buried layers formed on both sides of the projection and having second conductivity type impurity, current blocking layers each having one end which contacts a virtual surface obtained by extending upward a side surface of the active layer and having a first facet which extends downward from the one end and is inclined by about 55 degrees relative to the upper surface of the first cladding layer and formed on each buried layer and having the first conductivity type impurity, and second cladding layers formed on the current blocking layers and the active layer and having the second conductivity type impurity.

18 Claims, 9 Drawing Sheets

$\theta_2$ : Angle of K facet relative to the upper surface of the cladding layer 22

$\theta_3$ : Angle of the side surface of the mesa portion relative to the upper surface of the cladding layer $\theta_3 < \theta_2 < 90°$

SEMICONDUCTOR LASER AND METHOD OF MANUFACTURING THE SAME

BACKGROUND OF THE INVENTION

1. Field of the Invention

The present invention relates to a semiconductor laser and a method of manufacturing the same, more particularly, a semiconductor laser employed in optical fiber communication and having a buried heterostructure and a method of manufacturing the same.

2. Description of the Prior Art

As the application area of the optical fiber communication is spread from the trunk line system of the communication network to the subscriber system, an operation of the semiconductor laser as a light source is required in the wide temperature range circumstances. In particular, good laser characteristics must be attained at the high temperature at which an operating current is increased. At the same time, a required amount of the semiconductor laser is now increased.

Therefore, a structure for achieving the semiconductor laser which is operable up to the high temperature with good uniformity and a method of manufacturing the same are requested.

Normally a buried heterostructure is employed in the semiconductor laser used in the optical fiber communication. Such buried heterostructure is employed to inject a current to the active layer efficiently, and there are a buried heterostructure using a pn junction and a buried heterostructure using a semiinsulating layer. The buried heterostructure using the pn junction is suitable for the high temperature operation.

The semiconductor laser having the pn-junction buried heterostructure has a structure shown in FIG.1, for example.

In FIG.1, an active layer 2 of InGaAsP and a first p-type cladding layer 3 of p-InP are formed on an n-type InP substrate 1. Layers from the first p-type cladding layer 3 to an upper area of the n-InP substrate 1 are formed like a mesa shape to form a mesa portion. The active layer 2 in the mesa portion is formed as a stripe shape having a width of about 1 to 1.5 $\mu$m. The buried heterostructures are provided on both sides of the mesa portion.

A p-type buried layer 4 of p-InP and an n-type current blocking layer 5 of n-InP are formed in the buried regions. Then, a second p-type cladding layer 6 formed of p-InP and a p-type contact layer 7 formed of p-InGaAs are formed in sequence on the n-type current blocking layer 5 and the first p-type cladding layer 3.

In addition, a p-side electrode 8 is formed on the p-type contact layer 7 and an n-side electrode 9 is formed under the InP substrate 1.

The manufacturing method of the semiconductor laser having such buried heterostructure comprises the steps of forming the buried heterostructures by growing the active layer 2 and the first p-type cladding layer 3 on the n-InP substrate 1, and forming a substntial stripe shape layers by etching from the first p-type cladding layer 3 to the InP substrate 1 by using a mask, and then forming the p-type buried layer 4 and the n-type current blocking layer 5 on both sides of the substantial stripe shape layers.

In the recent optical communication laser, a quantum well structure or a strained-layer quantum well structure is employed as the active layer in many cases. The active layer shown hereinafter means not only the quantum well structure consisting of a well layer and a barrier layer but also a structure including the quantum well structure and upper and lower light guiding layers provided to put the quantum well structure between them.

As particular reports concerning the above-mentioned structure, there are Kondo et al., 1995 Autumn Meeting the Japan Society of Applied Physics 27p-ZA-5 and Chino et al., 1997 Spring Meeting the Japan Society of Applied Physics 30p-NG-11.

However, in the buried heterostructure semiconductor laser, it is important that the leakage current which is not passed through the active layer must be reduced in order to achieve the good characteristics at the high temperature.

In the laser having a pn buried heterostructure shown in FIG.1, both sides of the active layer 2 are buried by the p-type buried layers 4, and such layers are connected to the p-type cladding layers 3, 6 formed directly on the active layer 2.

Therefore, the leakage current which flows from the p-type cladding layers 3, 6 to the n-type InP substrate 1 via the p-type buried layers 4, via routes indicated by arrows in FIG.1, is generated in the high temperature operation. Since the leakage current depends on an interval between the active layer 2 and the n-type current blocking layer 5, a distance between the active layer 2 and the n-type current blocking layer 5 must be narrowed into about 0.2 $\mu$m, for example, in order to reduce the leakage current. In addition, such distance must be fabricated with good controllability in order to achieve the uniform laser characteristic.

However, in the prior art structure, an innermost point of the n-type current blocking layer 5 is set on an edge of a top surface of the mesa portion, but an angle θ of the bottom surface of the n-type current blocking layer 5 spreads in the neighborhood of the active layer 2 at a gentle angle of about 30 degrees relative to the horizontal direction. Therefore, the distance between the active layer 2 and the n-type current blocking layer 5 is abruptly increased downward, so that a width of the area through which the leakage current flows is excessively widely increased.

The angle θ of the bottom face of the n-type current blocking layer 5 depends on an angle of an upper surface of the p-type buried layer 4 formed under is the n-type current blocking layer 5. In other words, the (111) facet which has a slow growth rate appears at the beginning of growth in the crystal growth of the p-type buried layers 4, and then such bottom face having a gentle angle of about 30 degrees appears to start its growth on the (111) facet because of the dependence of the growth rate on facet orientation. A position and an angle of such bottom face are very sensitive to a height of the mesa portion, a lower shape of the mesa portion, change in the growth rates in respective face orientations due to the change in the growth conditions, etc.

Therefore, even if the p-type buried layer 4 is formed by the MOVPE (metal organic vapor-phase epitaxy) method which is said to have good controllability, it is difficult to fabricate uniformly the position of the n-type current blocking layer 5 with respect to the active layer 2 with good reproducibility.

SUMMARY OF THE INVENTION

It is an object of the present invention to provide a semiconductor laser capable of implementing a narrow distance between an active layer and current blocking layers formed over a substrate with good controllability, and a method of manufacturing the same.

According to the present invention, an angle of the side surfaces of the active layer which is formed on the mesa-type first cladding layer is set in the range of 70 to 90 degrees relative to the upper surface of the first cladding layer, then one end of the current blocking layer is brought into contact to an upward extension from the side surface fo the active layer, and then an angle of the facet of the current blocking layer which extends downward from the one end below the active layer is substantially inclined by 55 degrees.

Therefore, since the buried layers existing on both sides of the active layer are narrowed, the passage area for the leakage current which flows from the second cladding layer located over the active layer to the buried layer is made small to thus reduce the leakage current. As a result, the current-optical output power characteristic can be made uniform at the time of high temperature and high output power.

Such semiconductor laser manufacturing method can be attained by forming the active layer and the lower layer portion of the second cladding layer in sequence on the first cladding layer, then forming the mesa portion by patterning the layers from the lower layer portion of the second cladding layer to the upper layer portion of the first cladding layer by using the dry etching, and then forming the current blocking layer on the buried layer by controlling the growth of the buried layer such that the (111) facet exists from the side area of the active layer to the lower side thereof.

In this case, the (111) facet of the buried layer has an inclination of about 55 degrees relative to the substrate surface. In addition, formation of another facet on the (111) facet can be prevented previously by leaving the facet, which is formed in parallel with the side surface of the mesa portion, under the (111) facet of the buried layer.

Also, according to another present invention, the angle of the side surfaces of the active layer which is formed on the mesa-type first cladding layer is set in the range of 70 to 90 degrees relative to the upper surface of the first cladding layer, then one end of the current blocking layer is brought into contact to an upward extension from the side surface, and then the angle of the facet of the current blocking layer which extends downward from the one end is substantially inclined by 55 degrees, and then the angle of the other facet of current blocking layer which is formed to side of the active layer is set larger than an angle of the side surfaces of the active layer but smaller than 90 degrees on both sides of the active layer.

Therefore, since the shortest distance between the current blocking layer and the active layer can be set along overall side surfaces of the active layer, an area of the buried layer between them is narrowed. As a result, the leakage current which is passed through such area can be further reduced.

Such semiconductor laser manufacturing method can be attained by forming the active layer and the lower layer portion of the second cladding layer in sequence on the first cladding layer, then forming the mesa portion by patterning the layers from the lower layer portion of the second cladding layer to the upper layer portion of the first cladding layer by using the dry etching, and then controlling the growth of the buried layer such that the (111) facet exists over the active layer and the facet which is substantially parallel with the active layer appears below the (111) facet.

In this case, a film thickness of the buried layer between the first cladding layer and the current blocking layer must be sufficiently thick to prevent turn ON of a parasitic thyristor while reducing a film thickness of the buried layer which is to be grown on the side surface of the active layer. For this reason, there may be provided such a method that a desired film thickness is formed on the side surface of the active layer by using a chlorine containing gas in growth of the buried layer, and then an introduced amount of the chlorine containing gas is increased. Accordingly, the film thickness formed on the substrate surface can be increased locally.

By utilizing the present invention as above, a size of the buried layer in the region where the leakage current which has an influence upon the variation in the characteristics at the high temperature flows can be fabricated with good reproducibility. Therefore, the present invention can largely contribute to the highly-uniformed characteristic of the high-temperature operation optical communication semiconductor laser.

DESCRIPTION OF THE PREFERRED EMBODIMENT

Therefore, an embodiment of the present invention will be explained with reference to the accompanying drawings hereinafter.

FIGS. 2A to 2G show steps carried out until formation of a buried layer of a semiconductor laser according to an embodiment of the present invention is completed.

Figure 2A:
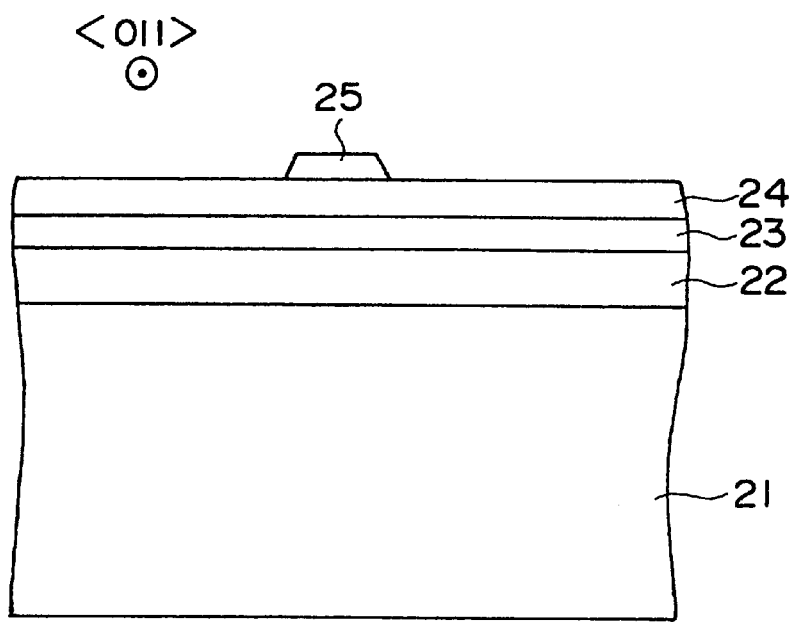
FIGS. 2A to 2G are sectional views each showing structures of a buried layer employed in a semiconductor laser of an embodiment of the present invention according to respective growing processes.

First, as shown in FIG. 2A, an n-type buffer layer (n-type cladding layer) 22 formed of n-InP of 300 to 1000 nm film thickness, a MQW (multi quantum well) active layer 23 formed of undoped InGaAsP of 200 to 300 nm film thickness, and a first p-type cladding layer 24 formed of p-InP of 250 to 700 nm film thickness are formed on a (100) facet of an n-InP substrate 21 by the MOVPE method.

The InP is grown by using trimethylindium (TMIn) and phosphine ($PH_3$) as a material gas. The InGaAsP is grown by using TMIn, $PH_3$, arsine ($AsH_3$), and triethylgallium (TEGa) as a material gas. Also, dimethylzinc (DMZn) is employed as a p-type dopant, and silane ($SiH_4$) is employed as an n-type dopant.

The MQW active layer 23 comprises, for example, five periodical well layers of InGaAsP having a thickness of 6 nm and 1% compressive strain, barrier layers each formed between the well layers and formed of InGaAsP whose lattice matches InP and which has a thickness of 10 nm, and light guiding layers each formed on and under the quantum well structure which consists of well and barrier layers and formed of InGaAsP of 100 nm thickness. Each of the barrier layers and the light guiding layers is formed of InGaAsP whose bandgap wavelength is 1.1 $\mu$m. Accordingly, a semiconductor laser whose wavelength band is 1.3 $\mu$m can be formed.

In this case, a layer structure of the MQW active layer 23 is not limited to such structure. Also, the active layer may be formed of an InGaAsP system which can provide a 1.55 $\mu$m band, a 1.48 $\mu$m band, and other wavelength bands.

An impurity concentration of the n-InP buffer layer 22 is about $5 \times 10^{17}$ atoms/cm$^3$, and an impurity concentration of the p-InP cladding layer 24 is about $5 \times 10^{17}$ atoms/cm$^3$.

Both the n-InP buffer layer 22 formed of n-InP under the active layer 23 and the n-InP substrate 21 act as an n-type cladding layer.

After the first film growth described above has been finished, a dielectric film, e.g., an SiO$_2$ film, having a thickness of about 0.3 $\mu$m is formed on the p-InP first p-type cladding layer 24 by the CVD method. Then, the dielectric film is patterned into a narrow stripe 25, which has a width of about 1.59 $\mu$m and extends along the <011>direction, by the photolithography method. The dielectric stripe 25 is used as a mask.

Figure 2B:
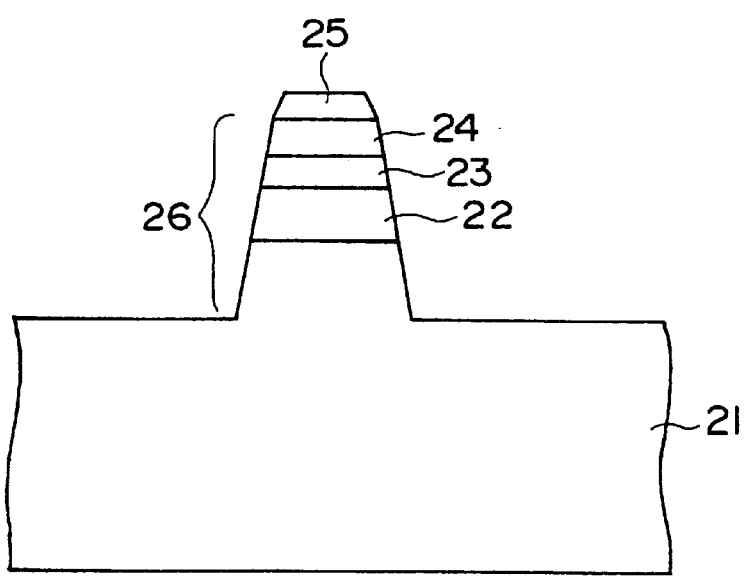

Then, as shown in FIG. 2B, the p-InP cladding layer 24 to the n-InP substrate 21, which are not covered with the mask 25, are etched up to a depth of almost 2 to 3 $\mu$m to thus form a mesa portion 26 under the mask 25. The mesa portion 26 is a projection which has a mesa-like sectional shape and a stripe-like planar shape. The etching is performed by the RIE (Reactive Ion Etching) method, and employs an ethane type gas, e.g., a mixed gas of C$_2$H$_6$, O$_2$, and H$_2$.

Then, surfaces of compound semiconductor layers, which are damaged by the dry etching, are removed by the acid treatment such as sulfuric acid, etc. Then, a p-InP buried layer 27 is grown on depressed areas on both sides of the mesa portion 26.

As shown in FIGS. 2C to 2G, this p-InP buried layer 27 will be grown according to following steps.

At first, the mask 25 is not extended from a top surface of the mesa portion 26 like a visor. Also, side surfaces of the mesa portion 26 are inclined sharply to have a 70 degrees or more relative to the horizontal direction (i.e., the substrate surface).

Under such condition, the p-InP buried layer 27 is formed by the second MOVPE method. In growing this p-InP buried layer 27, overgrowth of InP on the mask 25 can be prevented by introducing TMIn and PH$_3$ as a material gas into a reaction chamber of a MOVPE equipment and also introducing methyl chloride (CH$_3$Cl) together with the material gas into the reaction chamber, so that (111) facets can be grown from both edges of the top surface of the mesa portion 26.

Figure 2C:
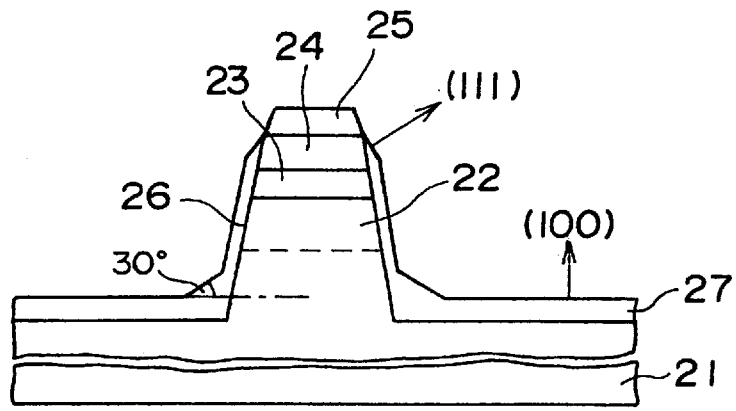

More particularly, as shown in FIG. 2C, as for the p-InP buried layer 27, the (111) facets appear downward from the edges of the top surface of the mesa portion 26, and two facets which parallel substantially the side surfaces of the mesa portion 26 appear on both sides of the mesa portion 26, other two facets which have a gentle angle of about 30 degrees relative to the substrate surface appear in the neighborhood of the bottom portion of the mesa portion 26, and (100) facets appear on the substrate surface on both sides of the mesa portion 26.

Figure 2D:
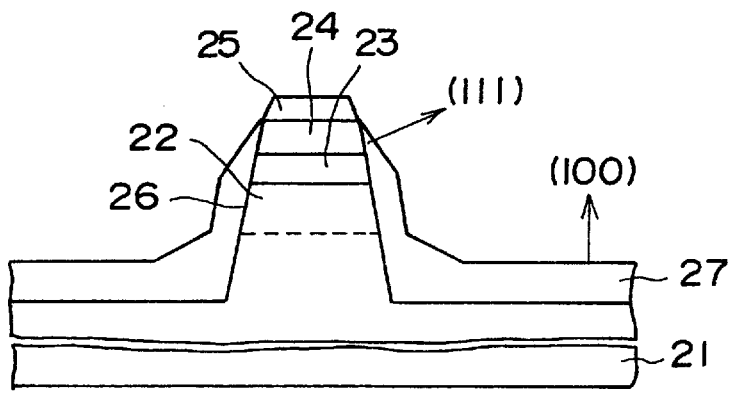

As shown in FIG. 2D, by keeping the growth of the p-InP buried layer 27, the (111) facets extend obliquely downward to spread much more, while the two facets which parallel the side surfaces of the mesa portion 26 are shortened along the side surfaces. Also, with the progress of the growth, the two facets, which substantially paralleled both sides of the mesa portion 26 at the beginning of the growth, become close gradually to the vertical direction relative to the substrate surface.

Figure 2E:
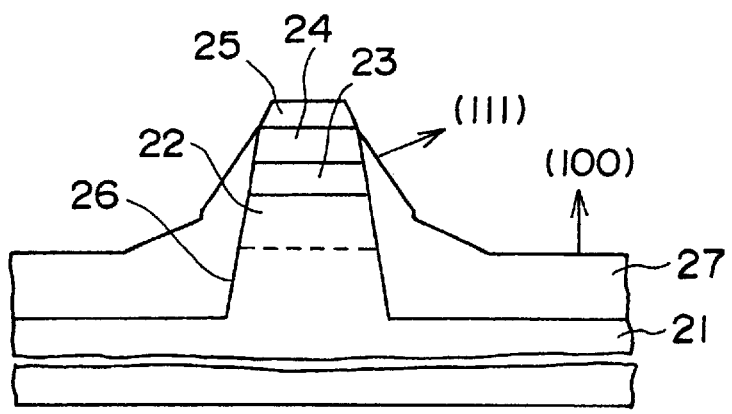

As shown in FIG. 2E, with the further progress of the growth of the p-InP buried layer 27, the two faces, which substantially paralleled both sides of the mesa portion 26, disappear.

Figure 2F:
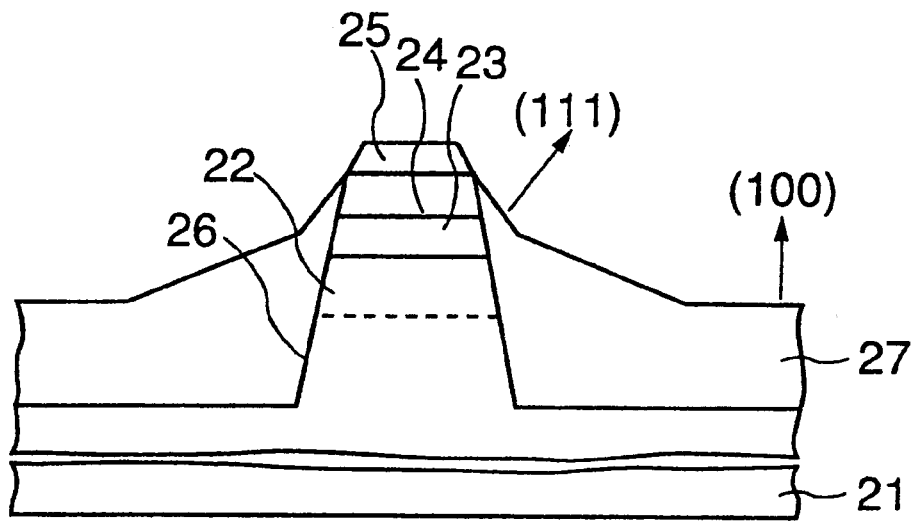
Figure 2G:
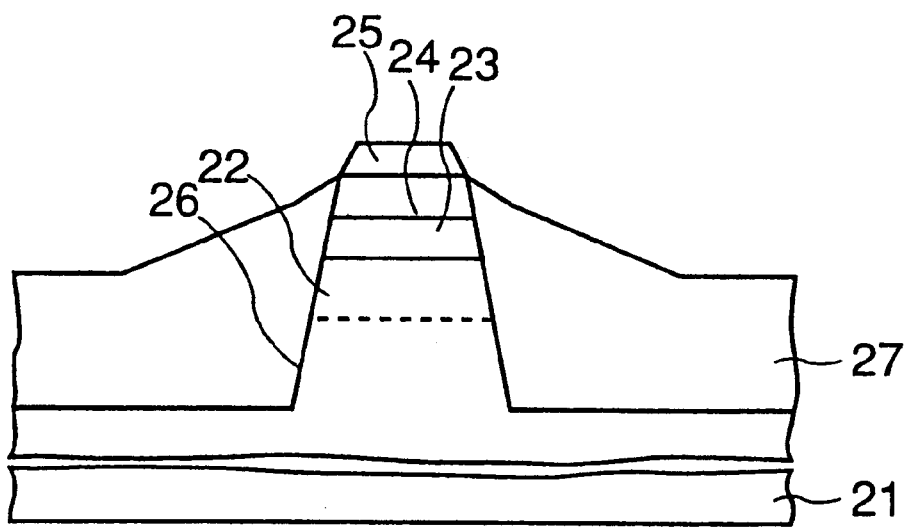

As shown in FIGS. 2F and 2G, the other two facets of the buried layer 27, each is grown from near the bottom of the mesa portion 26 to have the gentle angle of about 30 degrees, erode the (111) facets according to the furthermore progress of the growth of the p-InP buried layer 27, therefore the (111) facets are shortened. These appearances of above shapes are due to difference in the growth rates in respective facet orientations.

In the course of the above growth of the p-InP buried layer 27, not-mentioned faces and transition regions are appeared in the region where an angle of the face is changed (corner portions), but they are omitted from the figures.

According to above difference in shapes in the course of the growth of the p-InP buried layer 27, it is possible to form a semiconductor laser having a structure described in the following. In this case, in three following examples of the semiconductor laser, explanation will be made by omitting processes needed until the mesa portion 26 is formed.

FIRST EXAMPLE

The semiconductor laser described in the following shows an example wherein the growth of the p-InP buried layer 27 is stopped at the point of time when the facets, which are formed in parallel with the side surfaces of the mesa portion 26, of the p-InP buried layer 27 disappear, and then a current blocking layer is formed.

Figure 3A:
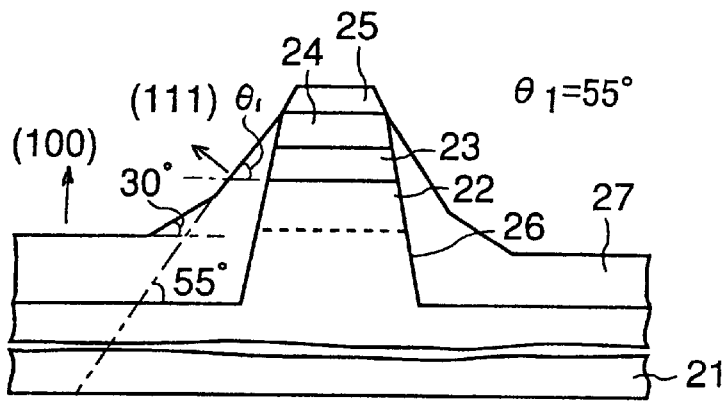
FIGS. 3A to 3C are sectional views showing growing steps for layers of a first example of a semiconductor laser according to the embodiment of the present invention.

More particularly, as shown in FIG. 3A, the (111) facets, 30-degrees inclined faces, and the (100) facets of the p-InP buried layer 27 whose growth has been completed are exposed in sequence along the direction from the edges of the top surface of the mesa portion 26 to the bottom.

In this case, a thickness of the active layer 23 is about 0.3 $\mu$m, a thickness of the first p-type cladding layer 24 is 0.4 $\mu$m, a height of the mesa portion 26 is about 2 $\mu$m, and an angle of the side surface of the active layer 23 of the mesa portion 26 is about 83 degrees. In addition, a film thickness of the flat portion of the p-InP buried layer 27 is 0.71 $\mu$m, and an angle of the (111) facet of the p-InP buried layer 27 is about 55 degrees relative to the horizontal line.

Figure 3B:
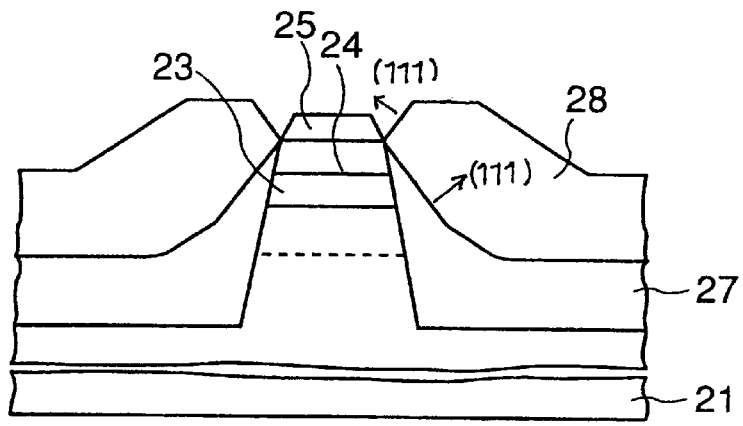

Under such conditions, as shown in FIG. 3B, when an n-InP current blocking layer 28 is formed on the p-InP buried layer 27 on both sides of the mesa portion 26, the bottom surface of the n-InP current blocking layer 28 has the same shape as the upper surface of the p-InP buried layer 27. Also, one end of the n-InP current blocking layer 28 is positioned over the active layer 23 by 0.4 $\mu$m along an extension of the side surface of the mesa portion 26.

In this case, a film thickness of the p-InP buried layer 27 is about 0.4 $\mu$m at the lower end of the side surface of the active layer 24. A shortest distance from an upper end of the active layer 24 to the n-InP current blocking layer 28 is about 0.19 $\mu$m. The thickness of the first p-type cladding layer 24 and an inclination of the side surface of the mesa portion 26 may be adjusted such that this shortest distance is present in the range of 0.1 to 0.3 $\mu$m.

If a film thickness of the n-InP current blocking layer 28 is set to about 0.9 μm in the flat region, the (111) facet as the bottom surface of the n-InP current blocking layer 28, which is a boundary between the pInP buried layer 27 and the n-InP current blocking layer 28, extend below the active layer 24 from its one end which is closest to the first p-type cladding layer 24. As the upper surface of the n-InP current blocking layer 28, an upward-inclined surface having (111) facet, a flat surface, and a downward-inclined surface appear in sequence from its one end which contacts to the side surface of the mesa portion 26.

After the growth of such n-InP current blocking layer 28 has been finished and then the mask 25 has been removed, the process is shifted to the third crystal growth steps.

Figure 3C:
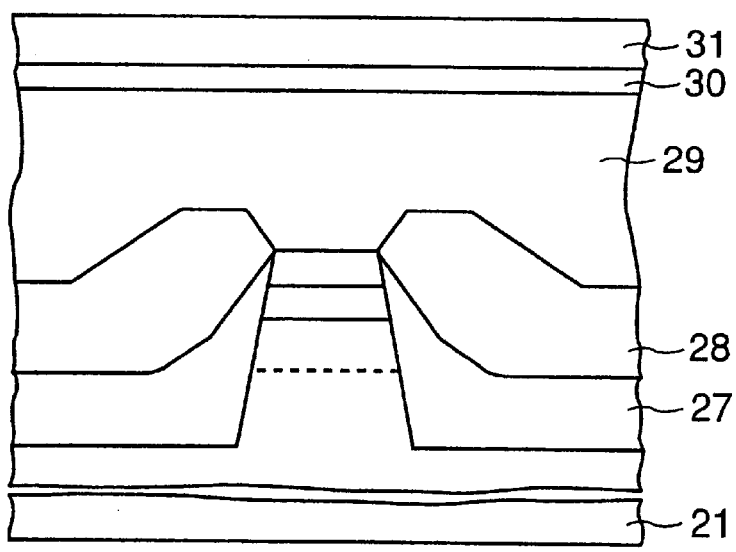

As shown in FIG. 3C, in the third MOVPE crystal growth, a second p-type cladding layer 29, which is formed of p-InP to have a film thickness of about 1.5 μm, is formed on the n-InP current blocking layer 28 and the first p-type cladding layer 24. Then, an intermediate layer 30 formed of p-InGaAsP having a 0.2 μm film thickness and a contact layer 31 formed of p$^+$-type InGaAs having a 0.5 μm film thickness are formed on the second p-type cladding layer 29.

Figure 3D:
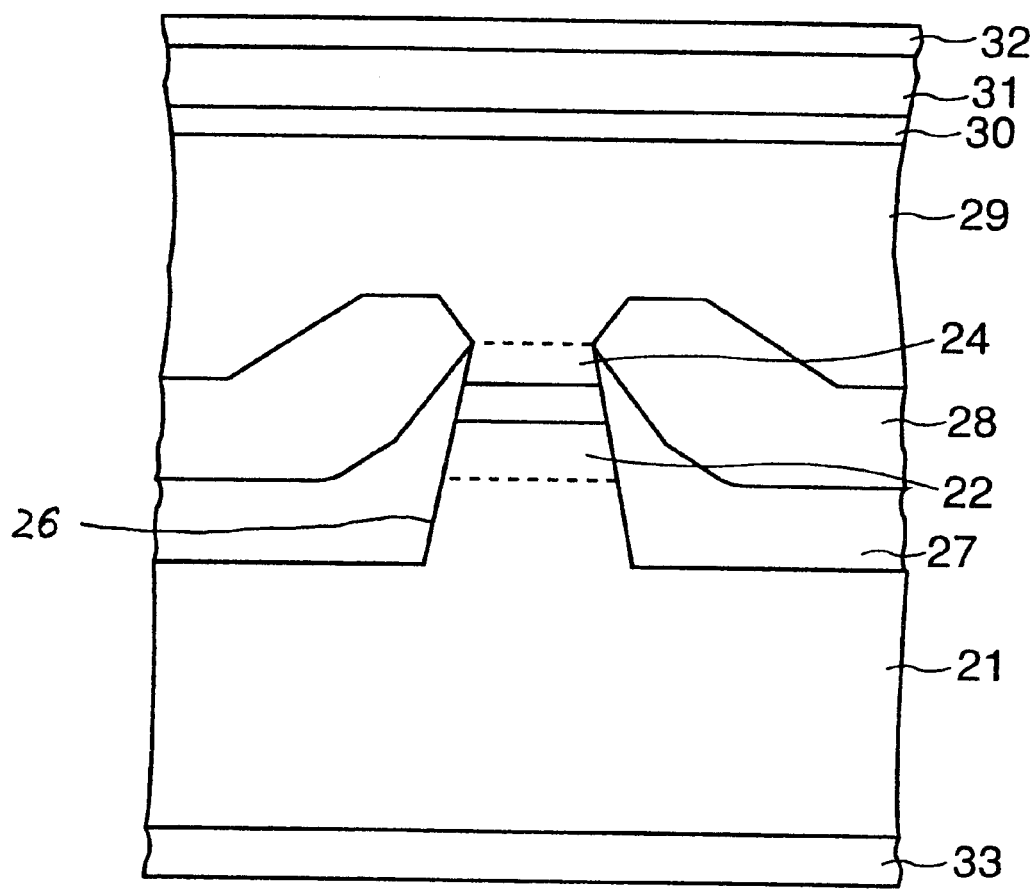
FIG. 3D is a sectional view showing the first example of the semiconductor laser according to the embodiment of the present invention.

Next, as shown in FIG. 3D, a p-side electrode 32 made of Ti/Pt/Au is formed on the contact layer 31, and then an n-side electrode 33 made of AuGe/Au is formed on the lower surface of the n-InP substrate 21.

In this case, above-mentioned film thicknesses are values in the flat regions unless they are not particularly mentioned.

With the above, a basic structure of the semiconductor laser has been completed.

According to the above semiconductor laser, since the surface which is close to the mesa portion 26 of the n-InP current blocking layer 28 has an angle of 55 degrees relative to the horizontal surface, the n-InP current blocking layer 28 is positioned closely to the active layer at a distance of less than 0.2 μm.

Accordingly, the region in which the first p-type cladding layer 24, the second p-type cladding layer 29, and the p-InP buried layer 27 are coupled can be narrowed rather than the prior art, and thus a leakage current which is passed through such region can be reduced.

In addition, since the growth condition of the buried layer 27, etc. are set such that the (111) facet, which appears in the neighborhood of the active layer 23, of the p-InP buried layer 27 can be extended below the active layer 23, the (111) facet can be positioned on both sides of the active layer 23 even if a height of the mesa portion 26 is slightly changed due to the error in fabrication.

Therefore, a distance between the n-InP current blocking layer 28 and the active layer 23 is substantially decided by a distance from the active layer 23 to the top surface of the mesa portion 26 (i.e., the first p-type cladding layer 24), and the error in the distance between the n-InP current blocking layer 28 and the active layer 23 in fabrication only depends on the deviation of the angle of the side surface of the mesa portion 26. Accordingly, a shortest width of the region through which the leakage current flows, i.e., a shortest distance of the clearance between the n-InP current blocking layer 28 and the active layer 23 does not depend on the growth conditions of the films and displacement of the height of the mesa portion 26 in fabrication. As a result, a magnitude of the leakage current can be reduced stably, the current-optical output power characteristic can be made uniform at the time of high temperature and high output power, and reproducibility can be improved.

In addition, in the first example, the upper (111) facet of the n-InP current blocking layer 28 is inclined by the angle of about 55 degrees and thus the uppermost portion of the (111) facet is positioned higher than the mesa portion 26. In this fashion, if the upper portions of the n-InP current blocking layer 28, which are located on both sides of the mesa portion 26, are made narrower toward the active layer 23 like a taper-shape, the injection current can be collected effectively into the upper area of the active layer 23 because the film thickness of the n-InP current blocking layer 28 is increased suddenly large in the neighborhood of the active layer 23.

However, there is no need that the upper portions of the n-InP current blocking layer 28 should be always risen on both sides of the mesa portion 26.

Also, as described above, since the side surfaces of the mesa portion 26 are formed extremely close to the vertical direction such as about 83 degrees, the distance between the n-InP layers (the n-InP buffer layer 22 and the n-InP substrate 21) under the active layer 23 and the n-InP current blocking layer 28 can be spread widely downward. Hence, a pnpn thyristor which consists of the p-type cladding layers 24 and 29, the n-InP current blocking layer 28, the p-InP buried layer 27, and the n-InP layers (the n-InP buffer layer 22 and the n-InP substrate 21) formed as the lower portion of the mesa portion 26 is difficult to turn ON.

As a result, if only the shortest distance between the n-InP current blocking layer 28 and the active layer 23 is considered, it is possible to control such shortest distance in a gentle spreading mesa shape in which respective layers which are lower than the active layer 23 are formed by the wet etching. However, from the viewpoint of the current blocking characteristic of the thyristor, it is possible to say that the mesa portion 26 having the side surfaces which are formed almost along the vertical direction, as formed by the dry etching, is preferable, like the first example.

SECOND EXAMPLE

A second example of the semiconductor laser is characterized by a structure in which, since the height of the mesa portion 26 is set higher like about 2.5 μm, the p-InP surfaces which are parallel with the side surfaces of the mesa portion can still remain on the p-InP buried layer 27 at the stage where the growth of the p-InP buried layer 27 is completed. In other words, in the second example, the growth of the p-InP buried layer is stopped at the stage shown in FIG. 2E.

Figure 4:
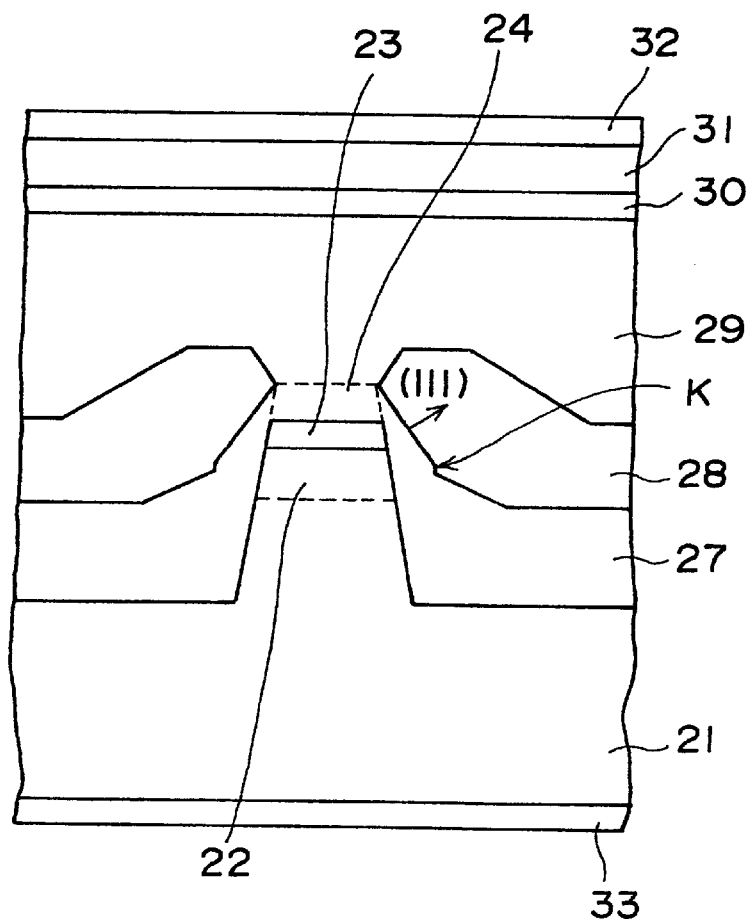
FIG. 4 is a sectional view showing a second example of the semiconductor laser according to the embodiment of the present invention.

After such p-InP buried layer 27 has been formed, like the first example, the n-InP current blocking layer 28 is formed on the p-InP buried layer 27, then the mask 25 is removed, and then the second p-type cladding layer 29, the p-InGaAsP intermediate layer 30, and the contact layer 31 formed of p$^+$-type InGaAs are formed on the n-InP current blocking layer 28 and the first p-type cladding layer 24 by the MOVPE method. Then, a semiconductor laser having a structure shown in FIG. 4 can be obtained by forming the p-side electrode 32 and the n-side electrode 33.

As described above, if the p-InP faces which are parallel with the side surfaces of the mesa portion 26 still remains on a part of the p-InP buried layer 27 before the p-InP buried layer 27 is grown, the p-InP cannot grow on the (111) facet of the p-InP buried layer 27, even when the growth rate of the p-InP buried layer 27 is slightly varied according to any change in the conditions. As a result, the thickness control of the p-InP film on the active layer 23, i.e., the control of the distance between the n-InP current blocking layer 28 and the active layer 23 can be made more easily without fail.

THIRD EXAMPLE

In the foregoing first example, the growth of the p-InP buried layer 27 is stopped in the situation between FIG. 2E and FIG. 2F, and then the n-InP current blocking layer 28 is formed.

On the contrary, in a third example, the growth of the p-InP buried layer 27 is stopped in the situation close to FIG. 2D, and then steps of growing the n-InP current blocking layer, etc. are employed.

Figure 5A:
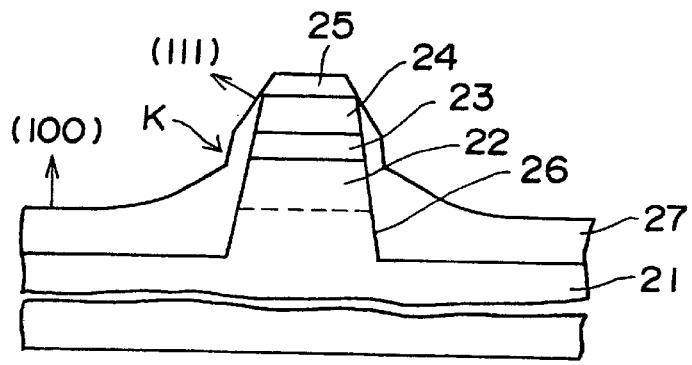
FIGS. 5A to 5C are sectional views showing manufacturing steps for a third example of a semiconductor laser according to the embodiment of the present invention.

More particularly, as shown in FIG. 5A, as for the surface shape of the buried layer 27 after its growth has been finished, the (111) facet appears obliquely downward from the edges of the top surface of the mesa portion 26, faces which are almost parallel with the side surfaces of the mesa portion 26 appear on both sides of the active layer 23, and 30-degrees inclined faces and (100) facets appear under the active layer 23. In this case, upper faces of the p-InP buried layer 27, which are substantially parallel with the active layer 23 are inclined larger than the side surfaces of the active layer 23 but smaller than a perpendicular angle to the substrate surface.

In this case, a height of the mesa portion 26 is about 2 μm, a thickness of the active layer 23 of the mesa portion 26 is about 0.3 μm, and a lower end of the active layer 23 is positioned over the bottom of the mesa portion 26 by about 1.3 μm. Also, a film thickness of the flat portion of the p-InP buried layer 27 is 0.6 μm, and an angle of the (111) facet of the p-InP buried layer 27 is about 55 degrees relative to the substrate surface (horizontal surface). In addition, a thickness of the p-InP buried layer 27 is about 0.2 μm on the side surfaces of the active layer 23 of the mesa portion 26.

In case the p-InP buried layer 27 having such profile is grown, following conditions are needed.

Figure 1:
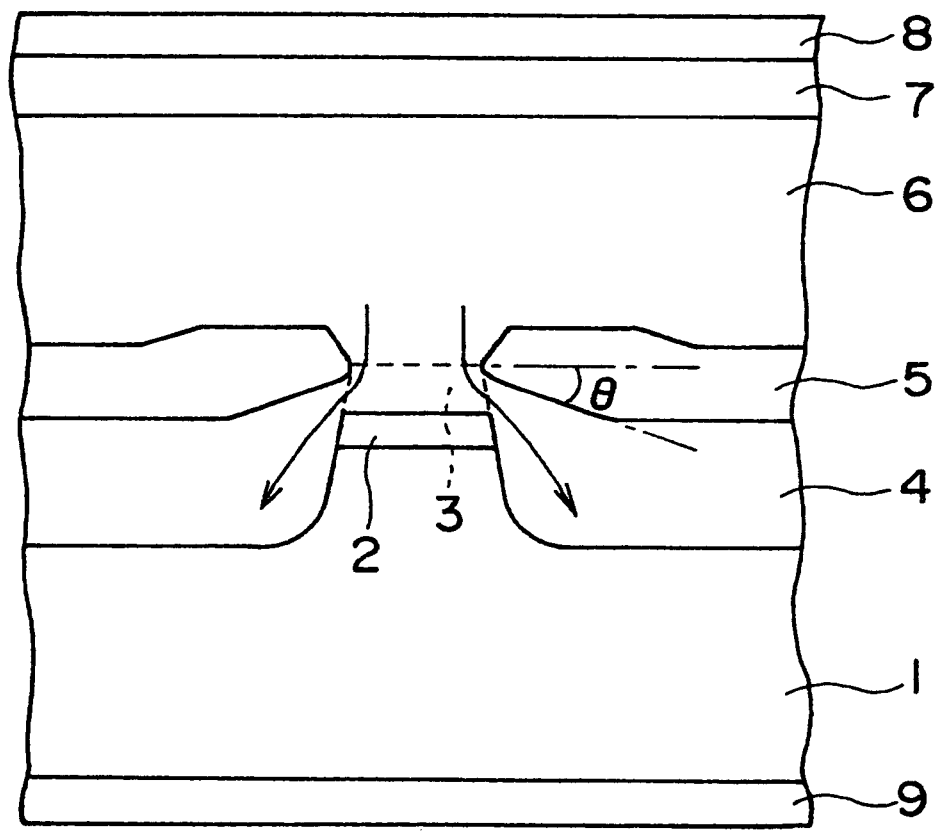
FIG. 1 is a sectional view showing a semiconductor laser in the prior art.

First, it is preferable that the mesa portion 26 should be formed by dry etching such that the side surfaces are formed almost vertically with respect to the substrate surface. This is because the film growth proceeds quickly on the face which is positioned close to a (211) facet and thus, if gently inclined surfaces shown in FIG. 1 appear on the side surfaces of the mesa portion when the mesa portion is formed by the wet etching, the faces of the p-InP buried layer 27 which are almost parallel with the side surfaces of the mesa portion 26 quickly disappear.

Also, because the p-InP buried layer 27 is merely grown on the side surfaces of the active layer 23 to have a film thickness of about 0.2 μm, the p-InP buried layer 27 cannot be formed thick on the horizontal surface (the substrate surface) by the simple method using the material gas only.

Then, when the film thickness of the flat portion of the p-InP buried layer 27 becomes thin on the n-InP substrate 21, the pnpn thyristor formed on both sides of the mesa portion is turned ON easily to thus increase the leakage current. Therefore, in the present structure, such a method is employed that the p-InP buried layer 27 has a thickness of 0.2 μm on the active layer 23 and has a thickness of 0.6 μm on the horizontal surface of the n-InP substrate 21.

As the actual method, like the first example, TMIn, PH$_3$ as well as CH$_3$Cl are introduced by a very small amount (the partial pressure is almost 14 mTorr) into the reaction chamber as the material gas, then the p-InP layer of about 0.2 μm thickness is grown on the side surfaces of the mesa portion 26 and the horizontal surface, then an introduced amount of CH$_3$Cl is increased up to the partial pressure of about 92 mTorr, and then the p-InP of about 0.4 μm thickness is grown.

If a flow rate of CH$_3$Cl is increased gradually at the time when the p-InP layer constituting the buried layer 27 is grown, the growth rate is abruptly lowered on the side surfaces of the mesa portion 26 in contrast to the growth rate on the substrate surface, and finally the p-InP layer is seldom grown on the side surfaces of the mesa portion 26 but only the thickness of the p-InP layer is increased on the substrate surface. According to such method, the p-InP buried layer 27 having a sectional shape shown in FIG. 5A can be formed, so that the pnpn thyristor structure in which only the p-InP layer on the side surfaces of the mesa portion 26 is formed thin can be provided.

In this case, the lower end of the faces, which are almost parallel with the side surfaces of the mesa portion 26, of the p-InP buried layer 27 is positioned substantially on an extension of the bottom surface of the active layer 23.

Figure 5B:
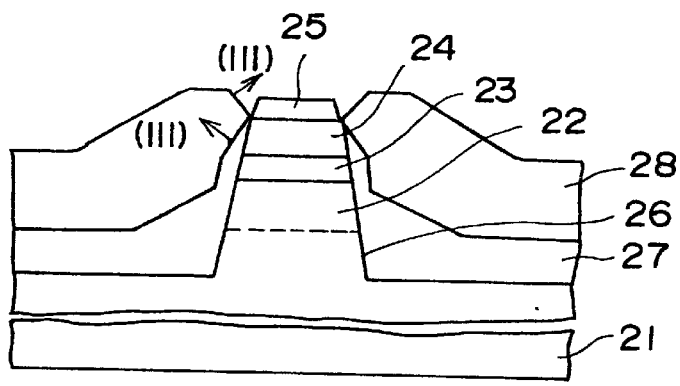

As shown in FIG. 5B, after the p-InP buried layer 27 has been formed as above, an n-InP current blocking layer 28 is grown on the p-InP buried layer 27 on both sides of the mesa portion 26. A shape of the bottom 20 surface of the n-InP current blocking layer 28 is similar to the upper surface of the p-InP buried layer. In this case, like the first example, its one end of the n-InP current blocking layer 28 contacts the edges of the top surface of the first p-type cladding layer 24, and the (111) facets of the n-InP current blocking layer 28 appear obliquely upward and downward from such one end respectively.

Therefore, the n-InP current blocking layer 28 is almost parallel with the side surface of the active layer 23 and is separated from such side surface by 0.2 μm in the region where the n-InP current blocking layers 28 are opposed to the side surfaces of the active layer 23.

According to such structure, the leakage current which flows from the n-InP current blocking layers 28 into the n-InP layer formed under the active layer 23 through the narrow p-InP buried layer 27 can be reduced.

After the growth of such n-InP current blocking layer 28 has been finished and then the mask 25 has been removed, the process is shifted to the third crystal growth steps.

Figure 5C:
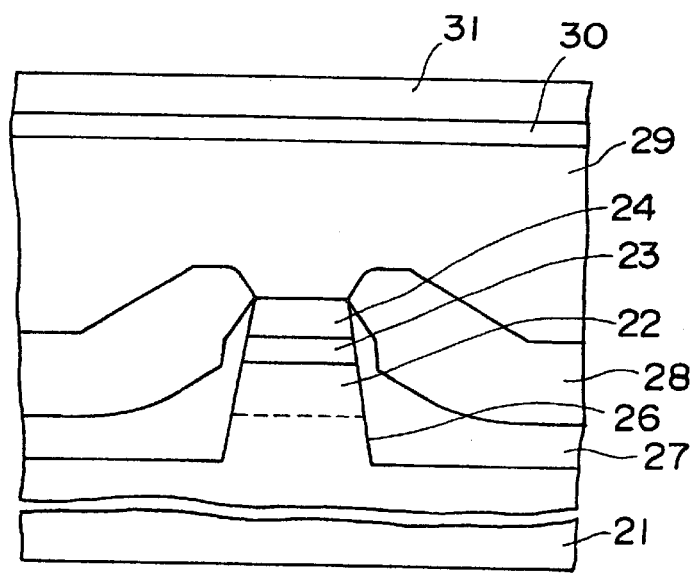

As shown in FIG. 5C, in the third crystal growth, a second p-InP cladding layer 29 which has a film thickness of about 1.5 μm is formed on the n-InP current blocking layer 28 and the first p-InP cladding layer 24. Then, the intermediate layer 30 formed of p-InGaAsP having a 0.2 μm thickness and the contact layer 31 formed of p$^+$-type InGaAs having a 0.5 μm thickness are formed on the second p-InP cladding layer 29.

Figure 5D:
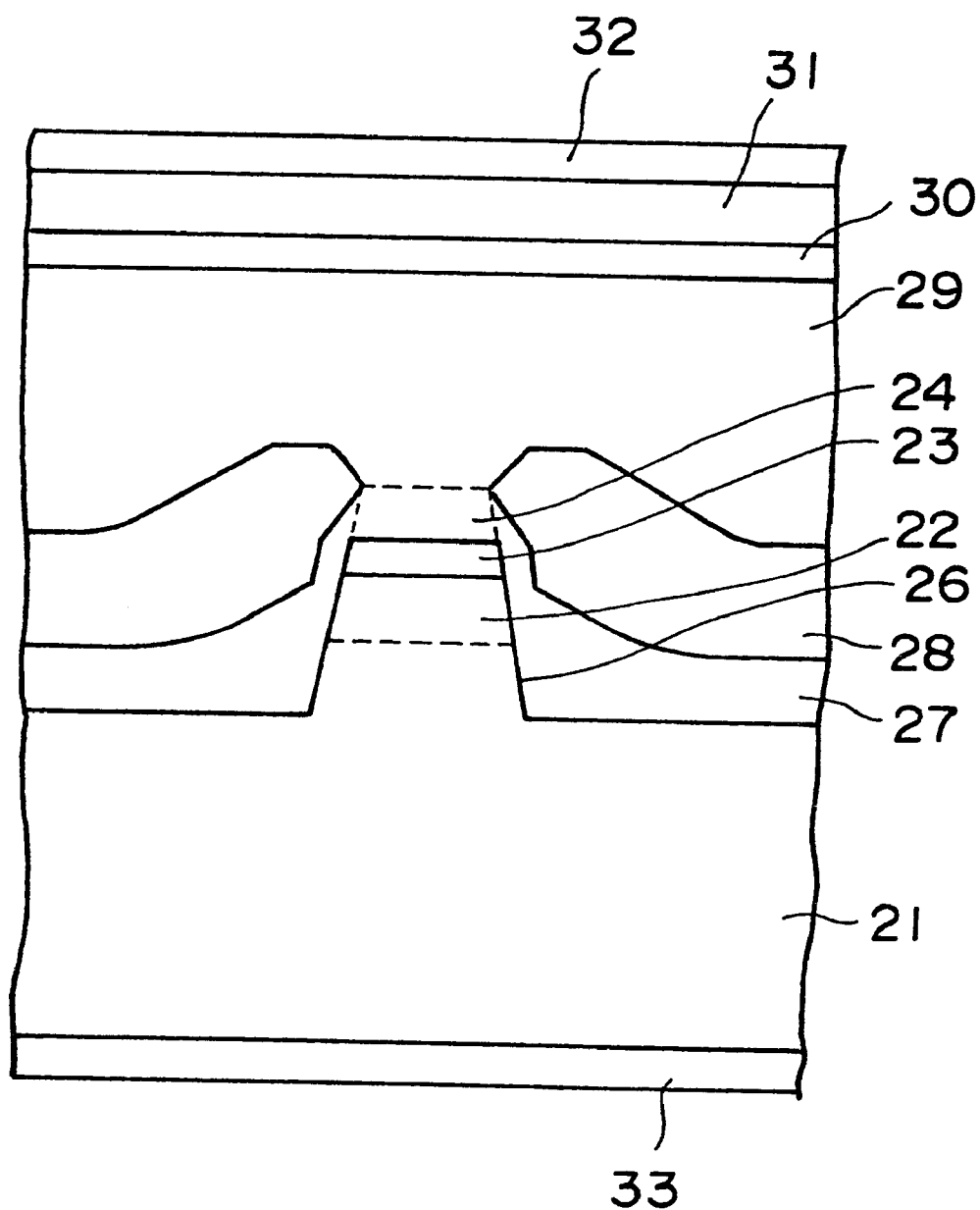
FIG. 5D is a sectional view showing the third example of the semiconductor laser according to the embodiment of the present invention.

Next, as shown in FIG. 5D, the p-side electrode 32 made of Ti/Pt/Au is formed on the contact layer 31, and then the n-side electrode 33 made of AuGe/Au is formed on the lower surface of the n-InP substrate 21.

With the above, a basic structure of the semiconductor laser has been completed.

According to the above, the semiconductor laser has such a structure that a part of the surface of the p-InP buried layer 27 being located on both sides of the active layer 23 is formed in almost parallel with the side surfaces of the mesa portion 26 (the active layer 23).

Accordingly, since the shortest portion of the distance between the active layer 23 and the n-InP current blocking layer 28 is not limited to one point on the side surface of the active layer 23 but spreads onto overall area of the side surface of the active layer 23, the advantage of reducing the leakage current can be increased rather than the semiconductor laser in the first example, and the current—optical output power characteristic can be made uniform at the time of high temperature and high output power. Unlike the first example, the distance between the active layer 23 and the n-InP current blocking layer 28 cannot be automatically decided, and therefore such distance is controlled by the grown film thickness of the p-InP buried layer 27.

However, controllability of the growth rate on a particular facet which is formed prior to the formation of the p-InP buried layer 27 is superior to the position control of the face which newly appears during growth in the prior art.

In other words, the side surfaces of the mesa portion 26 is decided prior to the formation of the p-InP buried layer 27. Although control of the film growth on the side surfaces is inferior to the growth control of the film on the perfectly flat substrate surface, controllability such as almost 0.01 μm can be achieved. As a result, uniformity of the film thickness can be remarkably improved rather than the prior art.

Also, in the third example, the mesa angle dependency of the growth rate of the p-InP buried layer 27 does not appear in the range of several angles. In addition, minute fluctuation of the mesa angle can be absorbed by the growth of the p-InP buried layer 27.

Although the explanation has been made using the Fabry-Perot type semiconductor laser in above three examples, it is a matter of course that the present invention may be applied to an optical device having a similar buried heterostructure such as a DFB (distributed feedback) laser or a DBR (distributed Bragg reflector) laser having the diffraction grating, a narrow radiation angle laser in which a taper waveguide is integrated, a semiconductor optical amplifier, or the like.

As described above, according to the present invention, an angle of the side surfaces of the active layer which is formed on the mesa-type first cladding layer is set in the range of 70 to 90 degrees relative to the upper surface of the first cladding layer, then one end of the current blocking layer is brought into contact to an upward extension of the side surface, and then an angle of the facet of the current blocking layer which extends downward from the one end below the active layer is substantially inclined by 55 degrees. Therefore, since the buried layers existing on both sides of the active layer are narrowed, the passage area for the leakage current which flows from the second cladding layer located over the active layer to the buried layer is made small to thus reduce the leakage current, and also the current—optical power characteristic can be made uniform at the time of high temperature and high output power.

In addition, according to another present invention, the angle of the side surfaces of the active layer which is formed on the mesa—type first cladding layer is set in the range of 70 to 90 degrees relative to the upper surface of the first cladding layer, then one end of the current blocking layer is brought into contact to an upward extension of the side surface, and then the angle of the facets of the current blocking layer which extends downward from the one end is substantially inclined by 55 degrees, and then the angle of other facet of the current blocking layer which is formed on side of the active layer is set larger than an angle of the side surfaces of the active layer but smaller than 90 degrees on both sides of the active layer. Therefore, the shortest distance between the current blocking layer and the active layer can be set along overall side surfaces of the active layer, and thus an area of the buried layer between them is narrowed. As a result, the leakage current which is passed through such area can be further reduced.

What is claimed is:

1. A semiconductor laser comprising:
    a first cladding layer formed of compound semiconductor including first conductivity type impurity and having a mesa-shaped projection;
    an active layer formed on the projection like a stripe, and having side surfaces inclined at an angle of more than 70 degrees but less than 90 degrees relative to an upper surface of the first cladding layer;
    buried layers including second conductivity type impurity which is different from the first conductivity type impurity formed on both sides of the projection;
    current blocking layers each having one end which contacts a virtual surface obtained by extending upward a side surface of the active layer and having a first facet which extends downward from the one end and is inclined by about 55 degrees relative to the upper surface of the first cladding layer, each of the current blocking layers having another facet which contacts the one end and is inclined upward from the one end so as to spread to a lateral side of the active layer from the one end, and the blocking layers including the first conductivity type impurity formed on each buried layer; and
    a second cladding layer including the second conductivity type impurity formed on the current blocking layers and the active layer.

2. A semiconductor laser according to claim 1, wherein each of boundaries between side surfaces of the first cladding layer of the projection and the buried layers extends to a position, which is lower than a lowest position of each of the current blocking layers, at an angle larger than 70 degrees but smaller than 90 degrees.

3. A semiconductor laser according to claim 1, wherein a shortest distance between the active layer and each of the current blocking layers is set in a range of 0.1 to 0.3 μm.

4. A semiconductor laser according to claim 1, wherein the another facet of the current blocking layer is inclined upward by an angle of about 55 degrees relative to a substrate surface.

5. A semiconductor laser according to claim 1, wherein a lower surface of each of the current blocking layers has, in addition to the first facet, a second facet positioned below the active layer to have an angle larger than 55 degrees, a third facet positioned below the second facet to have an angle smaller than 55 degrees, and a fourth facet extending laterally to the upper surface of the first cladding layer from a lower end of the third facet.

6. A semiconductor laser according to claim 5, wherein each of boundaries between side surfaces of the first cladding layer of the projection and the buried layers extends to a position, which is lower than a lowest position of each of the current blocking layers, at an angle larger than 70 degrees but smaller than 90 degrees.

7. A semiconductor laser comprising:
    a first cladding layer formed of a compound semiconductor including a first conductivity type impurity and having a mesa-shaped projection;
    an active layer formed on the projection like a stripe, and having side surfaces inclined at an angle of more than 70 degrees but less than 90 degrees relative to an upper surface of the first cladding layer;
    buried layers including a second conductivity type impurity which is different from the first conductivity type impurity formed on both sides of the projection;
    current blocking layers each having one end which contacts a virtual surface obtained by extending upward a side surface of the active layer and having a first facet which extends downward from the one end and is inclined by about 55 degrees relative to the upper surface of the first cladding layer and a second facet which is inclined larger than an angle of the side surface of the active layer but smaller than a perpendicular angle to the upper surface of the first cladding layer on a side of the active layer, each of the current blocking layers having a third facet which contacts the one end and is inclined upward from the one end so as to spread to a lateral side of the active layer from the one end, and formed on each buried layer and having the first conductivity type impurity; and a second cladding layer formed on the current blocking layers and the active layer, and having the second conductivity type impurity.

8. A semiconductor laser according to claim 7, wherein the second facet of each of the current blocking layers extends to a position which is equal to or lower than a lower surface of the active layer, and a lower surface of each of the current blocking layers has a third facet which extends from a lower end of the second facet away from the projection.

9. A semiconductor laser according to claim 8, wherein a shortest distance between the active layer and each of the current blocking layers is set in a range of 0.1 to 0.3 $\mu$m.

10. A semiconductor laser according to claim 8, wherein the third facet of the current blocking layer is inclined upward by an angle of about 55 degrees relative to a substrate surface.

11. A semiconductor laser manufacturing method comprising the steps of:

forming an active layer on a first cladding layer including a first conductivity type impurity;

forming a lower portion of a second cladding layer including a second conductivity type impurity which is different from the first conductivity type impurity on the active layer;

forming a stripe-shaped mask on the lower portion of the second cladding layer;

forming a stripe-shaped planar mesa portion by dry-etching respective layers from the lower layer of the second cladding layer to an upper area of the first cladding layer, which are not covered with the mask;

forming buried layers including the second conductivity type impurity, on side areas of the mesa portion, which have (111) facets extending from edges of the top surface of the mesa portion to a position lower than the active layer while spreading downward and;

forming current blocking layers including the first conductivity type impurity on the buried layers respectively, each of the current blocking layers having another facet which contacts one of the edges of the top surface of the mesa portion and is inclined upward from one of the edges so as to spread to a lateral side of the active layer from the one of the edges; and forming an upper portion of the second cladding layer on the lower portion of the second cladding layer and the current blocking layer after the mask has been removed.

12. A semiconductor laser manufacturing method according to claim 11, wherein the buried layers are grown while using a chlorine containing gas and a material gas.

13. A semiconductor laser manufacturing method according to claim 12, wherein the chlorine containing gas is a methyl chloride gas.

14. A semiconductor laser manufacturing method comprising the steps of:

forming an active layer on a first cladding layer including a first conductivity type impurity;

forming a lower portion of a second cladding layer including a second conductivity type impurity on the active layer;

forming a stripe-shaped mask on the lower portion of the second cladding layer;

forming a stripe-shaped planar mesa portion by dry-etching respective layers from the lower portion of the second cladding layer to an upper portion of the first cladding layer, which are not covered with the mask;

forming buried layers including the second conductivity type impurity on both side areas of the mesa portion, the buried layers having first facets as (111) facets extending downward from edges of the top surface of the mesa portion while spreading and second facets which are positioned below the first facets and are inclined at an angle between an angle of a side surface of the active layer and a perpendicular angle to an upper surface of the first cladding layer on both side areas of the active layer;

forming current blocking layers including the first conductivity type impurity on the buried layers respectively, each of the current blocking layers having another facet which contacts one of the edges of the top surface of the mesa portion and is inclined upward from one of the edges so as to spread to a lateral side of the active layer from the one of the edges; and forming an upper portion of the second cladding layer on the lower portion of the second cladding layer and the current blocking layer after the mask has been removed.

15. A semiconductor laser manufacturing method according to claim 14, wherein the buried layers are formed via such a growing process that the growth proceeds locally only in an area positioned lower than the active layer by setting substantially a growth rate on both side surfaces to zero after layers each having a predetermined film thickness are formed on both side surfaces of the active layer.

16. A semiconductor laser manufacturing method according to claim 15, wherein, in the growing process of the buried layers, the growth of the buried layers proceeds locally only in a position lower than the active layer by increasing a flow rate of a methyl chloride gas to then change the growth rate on both side surfaces of the active layer substantially to zero, while using a gas containing methyl chloride.

17. A semiconductor laser manufacturing method according to claim 14, wherein the buried layers are grown while using a chlorine containing gas together with a material gas.

18. A semiconductor laser manufacturing method according to claim 17, wherein the chlorine containing gas is a methyl chloride gas.

* * * * *